(12) United States Patent
Calvanese Strinati (10) Patent No.: US 8,879,463 B2
(45) Date of Patent: Nov. 4, 2014

(54) ADAPTIVE DISTRIBUTED TURBOCODING METHOD FOR A COOPERATIVE NETWORK

(75) Inventor: Emilio Calvanese Strinati, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 159 days.

(21) Appl. No.: 13/511,400

(22) PCT Filed: Nov. 26, 2010

(86) PCT No.: PCT/EP2010/068338
§ 371 (c)(1),
(2), (4) Date: May 23, 2012

(87) PCT Pub. No.: WO2011/064345
PCT Pub. Date: Jun. 3, 2011

(65) Prior Publication Data
US 2012/0281616 A1 Nov. 8, 2012

(30) Foreign Application Priority Data

Nov. 27, 2009 (FR) ...................................... 09 58435

(51) Int. Cl.
| | | |
|---|---|---|
| *H04B 7/14* | (2006.01) | |
| *H04L 1/00* | (2006.01) | |
| *H03M 13/29* | (2006.01) | |
| *H04B 7/155* | (2006.01) | |

(52) U.S. Cl.
CPC ......... *H04L 1/0009* (2013.01); *H03M 13/2957* (2013.01); *H04L 1/0059* (2013.01); *H04B 7/15592* (2013.01); *H04L 2001/0097* (2013.01)

USPC ........... 370/315; 370/328; 370/341; 714/752; 714/758

(58) Field of Classification Search
CPC ...... H04L 1/1812; H03M 1/141; H03M 7/40; H03M 13/27; H03M 13/296; H03M 13/299; H03M 13/3707; H03M 13/3776
USPC ................. 370/315, 328–329, 334, 341, 343; 714/755, 790
See application file for complete search history.

(56) References Cited

U.S. PATENT DOCUMENTS

| | | | | |
|---|---|---|---|---|
| 6,574,291 | B2 * | 6/2003 | Doetsch et al. ................ | 375/341 |
| 7,643,444 | B2 * | 1/2010 | Kim .............................. | 370/328 |
| 7,944,871 | B2 * | 5/2011 | Imamura et al. .............. | 370/315 |
| 8,027,286 | B2 * | 9/2011 | Khan ............................ | 370/315 |
| 8,358,608 | B2 * | 1/2013 | Josiam et al. ................. | 370/315 |

(Continued)

OTHER PUBLICATIONS

International Search Report issued Apr. 13, 2011 in PCT/EP2010/068338.

(Continued)

*Primary Examiner* — Charles C Jiang
*Assistant Examiner* — Mohamed Kamara
(74) *Attorney, Agent, or Firm* — Oblon, Spivak, McClelland, Maier & Neustadt, L.L.P.

(57) ABSTRACT

A method for transmitting packets in a cooperative network including a source terminal, a recipient terminal, and at least one relay terminal, the method using a turbocoding distributed between the source terminal and the relay terminal, one of the components of the turbocoder located in the source terminal or the relay terminal, or even both components being adaptive as a function of a characteristic of the transmission channel.

5 Claims, 6 Drawing Sheets

(56) References Cited

U.S. PATENT DOCUMENTS

2003/0115532 A1* 6/2003 Kim et al. .................. 714/758
2004/0266358 A1 12/2004 Pietraski et al.
2007/0173201 A1 7/2007 Pietraski et al.
2008/0065946 A1* 3/2008 Choi et al. .................. 714/752

OTHER PUBLICATIONS

Ragnar Thobaben, "On Distributed Codes with Noisy Relays", 42nd Asilomar Conference on Signals, Systems and Computers, XP031475440, Oct. 26, 2008, pp. 1010-1014.

Yuanyuan Zhang, et al., "Improved Coded Cooperation Schemes for Wireless Communications", 6th International Symposium on Modeling and Optimization in Mobile, Ad Hoc, and Wireless Networks and Workshops, XP031295939, Apr. 1, 2008, 6 pages.

Hieu T. Nguyen, et al., "Bandwidth-efficient Bit-interleaved Coded Cooperative Communications", Wireless Personal Communications, vol. 46, No. 3, XP019617235, Nov. 16, 2007, pp. 247-268.

Stefan Valentin, et al., "Cooperative wireless networking beyond store-and-forward: Perspectives for PHY and MAC design", WWRF WG3 Whitepaper, 2006, pp. 1-14.

B. Zhao, et al., "Distributed turbo coded diversity for relay channel", Electronics Letters, vol. 39, No. 10, May 15, 2003, pp. 786-787.

Claude Berrou, et al., "Near Shannon Limit Error—Correcting Coding and Decoding: Turbo-Codes (1)", IEEE, 1993, pp. 1064-1070.

Oscar Y. Takeshita, et al., "A Note on Asymmetric Turbo-Codes", IEEE Communications Letters, vol. 3, No. 3, Mar. 1999, pp. 69-71.

Peter C. Massey, et al., "New Developments in Asymmetric Turbo Codes", Proc. of International Symposium on Turbo Codes and Related Topics, 2000, pp. 93-100.

* cited by examiner

ADAPTIVE DISTRIBUTED TURBOCODING METHOD FOR A COOPERATIVE NETWORK

TECHNICAL FIELD

The present invention generally relates to the field of so-called cooperative networks and more particularly those using a turbocoding distributed between a source terminal and at least one terminal.

STATE OF PRIOR ART

Wireless telecommunication networks conventionally suffer from limitations due to fading and interference phenomena affecting transmission channels. In order to overcome these limitations, cooperation strategies between terminals of a network have been proposed. For example, a description of such cooperation strategies will be found in the article to S. Valentin et al. entitled "Cooperative wireless networking beyond store-and forward: perspectives for PHY and MAC design" published in Wireless Personal Communications, published by Springer Link, 2006.

Figure 1:
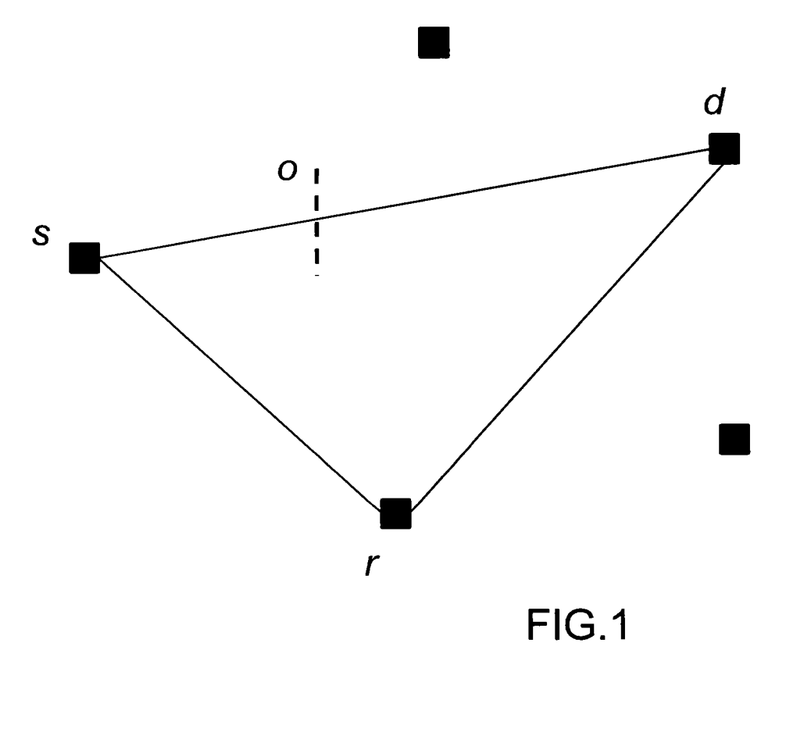
FIG. 1 schematically illustrates a very simple example of cooperative network known in the state of the art.

FIG. 1 very schematically represents a cooperation strategy within a wireless network. It is assumed that a source terminal s transmits a data flow to a recipient terminal d. The terminal r also receives the data flow from s and relays it to the recipient terminal d. The terminal r thus cooperates in the data transmission between terminals s and d. For example, if the channel s-d is of poor quality, in particular because of the presence of an obstacle o between s and d (for example NLOS configuration), the channel s-r-d can allow it to be bypassed and a satisfactory circuit quality to be obtained. The data flow can be relayed by several terminals to further increase the spatial diversity of transmission paths.

Access sharing families in a wireless network are known: TDMA (time share), CDMA (code share), SDMA (spatial share). In a TDMA (Time Division Multiple Access) network, each terminal has a dedicated transmission interval. Two possible cooperation modes are distinguished in a cooperating TDMA network: the parallel cooperation and the series cooperation.

In a parallel cooperation mode, the relay terminal receives data from the source terminal during the transmission interval allocated thereto and retransmits them to the recipient terminal during its own transmission interval. The recipient terminal thus receives the same data, via different paths, a first time during the transmission interval of the source terminal and a second time during the transmission interval of the relay terminal. Although the word "parallel" could seem ill chosen because of the sequential data reception by the recipient terminal, it actually refers to the absence of interference between both paths, resulting from the time separation of transmission intervals of the source and relay terminals. The operation in parallel cooperation mode assumes that the relay terminal does not have its own data to be transmitted during its transmission interval.

In a series cooperation mode, the relay terminal receives data from the source terminal during the transmission interval thereof and transmits them in the same interval. The recipient terminal thus receives data from the source terminal, via two different paths during a transmission interval of the source terminal.

Because of the simultaneous transmission of the own data and data relayed during the same transmission interval, these data are generally transmitted on different frequencies or using orthogonal codes.

Generally, a cooperative network comprising a source terminal s, a recipient terminal d and at least one relay terminal r, regardless of the type of cooperation strategy contemplated, will be dealt with. The transmission channels s-d and r-d can in particular correspond to different transmission intervals and/or different transmission frequencies.

A particularly elegant cooperation strategy has been provided in the article to B. Zhao et al. entitled "Distributed turbo coded diversity for relay channel" published in Electronics Letters, Vol. 39, No. 10, May 15, 2003. This strategy aims at implementing a turbocoder distributed between a source terminal and a relay terminal, a first component of the turbocode being implemented in the source terminal and a second component of the turbocode in the relay terminal.

It will be first remembered that turbocodes have been introduced by C. Berrou et al. in the pioneer article "Near Shannon limit error-correcting coding and decoding: Turbo Codes", Proceedings of IEEE '93 pp. 1064-1070, and they have been intensively researched since then. Turbocodes actually have remarkable performances in terms of bit error rate (BER) or frame error rate, enabling the channel Shannon capacity to be approximated.

Figure 2:
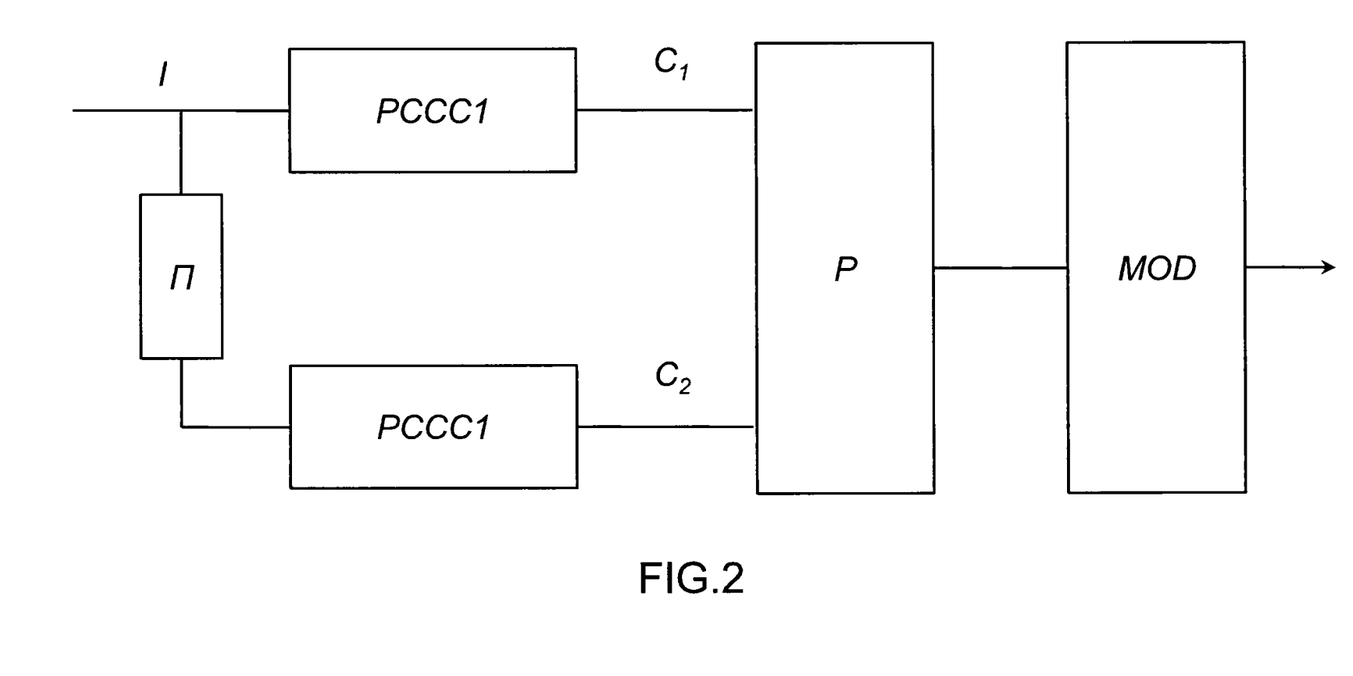
FIG. 2 schematically illustrates an example of turbocoder known in the state of the art.

FIG. 2 represents an exemplary turbocoder consisting of the parallel concatenation of two convolutional coders PCCC1 and PCCC2. The information bits to be transmitted, symbolized by the flow I, are coded on the one hand by means of the convolutional coder PCCC1 and on the other hand by means of the convolutional coder PCCC2, after they have been interleaved by means of the interleaver Π. The bits thus coded, symbolized by the flow $C_1$ output from PCC and the flow $C_2$ output from $PCCC_2$ can be punctured in the puncturer P. The bit flows thus punctured are then modulated by a bit to symbol modulator MOD before they are transmitted on the channel.

Conventionally, the convolutional coders PCCC1 and PCCC2 are systematic recursive coders. In this case, those skilled in the art will understand that the coder PCCC1 provides information bits I and parity bits $P_1$, the coder PCCC1 then only providing parity bits $P_2$ without providing the systematic part again.

Figure 3:
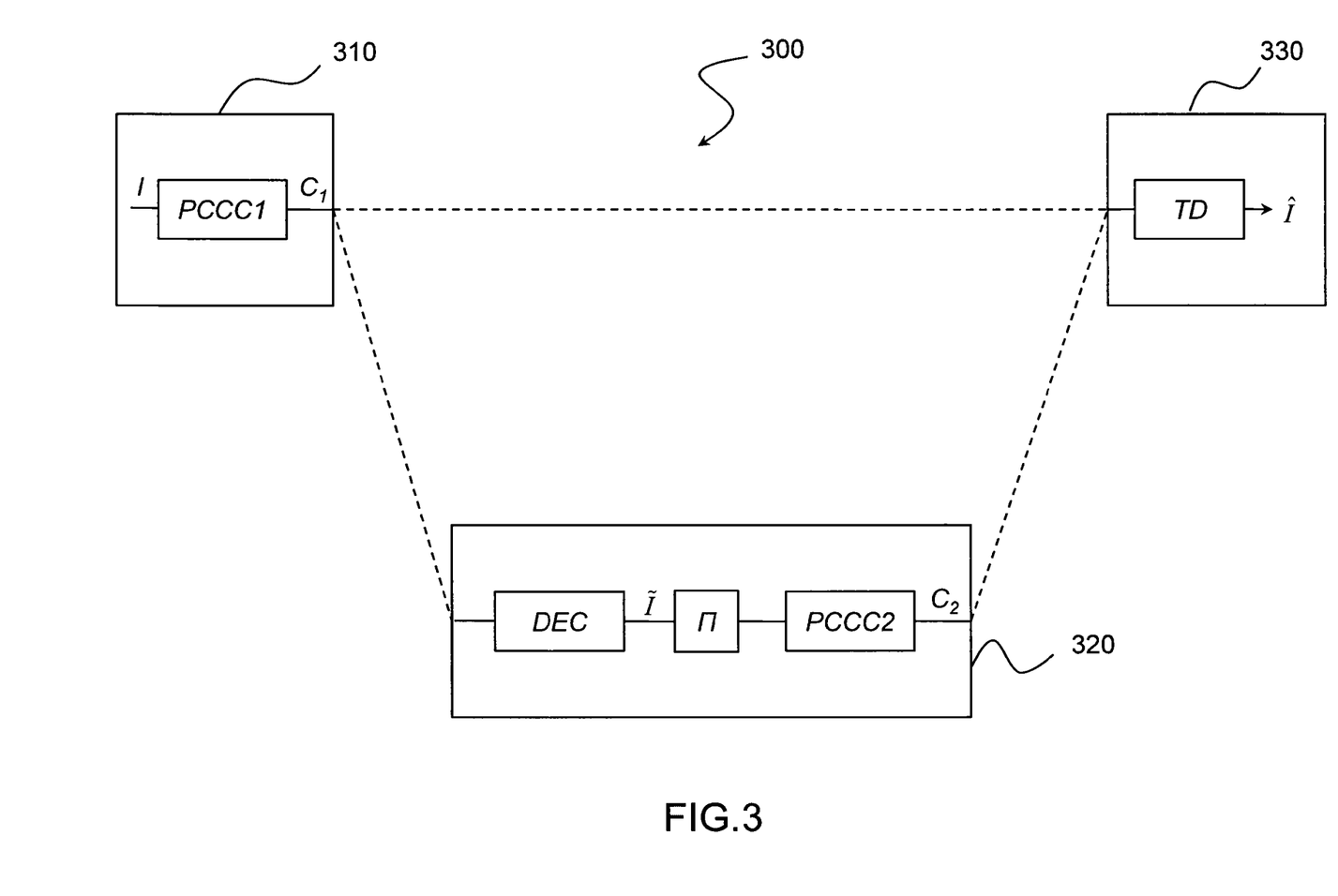
FIG. 3 schematically illustrates a cooperative network using a turbocoder distributed between a source terminal and a relay terminal, such as known in the state of the art.

FIG. 3 represents one exemplary cooperative network such as described in the abovementioned article to B. Zhao et al.

The cooperative network 300 comprises a turbocoder distributed between a source terminal 310 and a relay terminal 320. More precisely, the information bits I are coded within the source terminal 310 by a first convolutional coder $PCCC_1$. Thus coded bit flow, noted $C_1$, is optionally punctured before being bit to symbol modulated. For simplification purposes, the (optional) puncturer and the modulator have not been represented in the scheme.

Thus transmitted symbols are received by the relay terminal 320, on the one hand, and the recipient terminal 330 on the other hand.

Symbols received by the relay terminal 320 are first demodulated by a symbol to bit demodulator (not represented) and thus obtained bits are decoded by means of the decoder DEC. Decoded bits, making up the flow Ĩ, are interleaved by the interleaver Π before being again coded in the second convolutional coder $PCCC_2$. Coders PCCC1 and $PCCC_2$ are systematic recursive coders having the same structure. The coded bit flow noted $C_2$, is punctured before being modulated by a bit to symbol modulator. Once again, the puncturer and the modulator have not been represented for simplification purposes.

The recipient terminal 330 thus receives on distinct resources (transmission intervals, transmission frequencies, orthogonal codes) the symbols transmitted by the source terminal and the relay terminal. The spatial separation between the source terminal and the relay terminal, on the one hand, and optionally the use of distinct transmission resources, on the other hand, introduce a transmission diversity which can be exploited by the receiver. The bit flow received from the source terminal is noted $\tilde{C}_1$ and the bit flow received from the relay terminal is noted $\tilde{C}_2$.

The receiver comprises a turbodecoder TD having a conventional structure performing decoding iterations, each iteration implementing a first unit decoder corresponding to the first convolutional coder and operating on the flow $\tilde{C}_1$ and a second unit decoder corresponding to the second convolutional coder and operating on the flow $\tilde{C}_2$, a unit decoder assessing and transmitting to the other extrinsic information about the systematic bits at each half iteration.

The cooperative network illustrated in FIG. 3 has satisfactory performances when the respective transmission channels between the source terminal and the recipient terminal, and between the relay terminal and the recipient terminal, are Gaussian channels (AWGN) having signal to noise ratios (SNR) in the same order of magnitude. However, in practice, these conditions are rarely met because the channels have fadings which vary as a function of time and frequency. Furthermore, even in the case where terminals are fixed and channels do not have a fading, the signal to noise ratio is rarely in the same order of magnitude on both paths s-d and r-d.

One object of the present invention is therefore to provide a transmission method in a cooperative network which overcomes the previous problems, in particular which enables good performances in terms of bit or packet error rate to be obtained, in real situations, in particular when channels have fadings.

DESCRIPTION OF THE INVENTION

The present invention is defined by a method for transmitting data packets for a cooperative network comprising a source terminal, a recipient terminal and at least one relay terminal. The source terminal codes a data packet using a first convolutional coder for generating a first coded packet and transmitting it to the recipient terminal as well as the relay terminal. The relay terminal receives and decodes the first coded packet, interleaves the data of thus decoded packet and codes the packet of interleaved data using a second convolutional coder for generating a second coded packet and transmitting it to said recipient terminal, the first and second convolutional coders forming a turbocoder distributed between the source terminal and the relay terminal. According to the method of the invention:

(a) the first convolutional coder is selected from a plurality of first predetermined convolutional coders, and/or
(b) said second convolutional coder is selected from a plurality of second predetermined convolutional coders;
the selection in (a) and/or (b) being performed from a characteristic of the channel between the source terminal and the recipient terminal and/or the channel between the relay terminal and the recipient terminal.

According to a first alternative, said characteristic of the channel comprises the type of environment in which it is located.

For example, said characteristic of the channel comprises the fixed or mobile nature of the recipient terminal.

According to a second alternative, said characteristic of the channel comprises information about the channel status sent back by the recipient terminal.

Said characteristic of the channel can be for example a bit error rate or a packet error rate.

Said characteristic of the channel can further be a signal to noise ratio.

In this case, when the signal to noise ratio on the channel is lower than a first predetermined threshold, a first weak type convolutional coder can be selected and when the same signal to noise ratio is higher than this first threshold, a first strong type convolutional coder can be selected.

When the signal to noise ratio on the channel is lower than a second predetermined threshold, a second weak type convolutional coder can be selected and when the same signal to noise ratio is higher than this second threshold, a second strong type convolutional coder can be selected.

When the signal to noise ratio on the channel between the source terminal and the recipient terminal is higher than that on the channel between the relay terminal and the recipient terminal, a first convolutional coder stronger than the second convolutional coder can be selected in the source terminal and, in the opposite case, a first convolutional coder weaker than the second convolutional coder can be selected.

If said channel is a block fading channel, said characteristic can advantageously comprise statistics about fading coefficients on the channel.

In this case, for each predetermined first convolutional coder and/or second convolutional coder, the bit error or packet error conditional probabilities relating to different possible values of said fading coefficients can be advantageously calculated and bit error or packet error probability bounds that would be obtained using said predetermined first convolutional coder and/or said second convolutional coder are deduced therefrom.

In this case, the predetermined first convolutional coder and/or second convolutional coder can be selected enabling the lowest bit error rate or packet error rate bound to be obtained.

According to a first embodiment, the source terminal controls both the selection of the first and/or second convolutional coder.

Alternatively, according to a second embodiment, the source terminal controls the selection of the first convolutional coder and/or the relay terminal controls the selection of the second convolutional coder.

BRIEF DESCRIPTION OF THE DRAWINGS

Further characteristics and advantages of the invention will appear upon reading a preferential embodiment of the invention in reference to the appended figures wherein.

DETAILED DESCRIPTION OF PARTICULAR EMBODIMENTS

The case of a cooperating telecommunication system comprising a source terminal, a recipient terminal and at least one relay terminal will be considered again. It will be assumed that each terminal transmits data in packets (or frames) thanks to dedicated transmission resources, for example such as transmission time intervals (TTI), frequencies or intervals of subcarriers (in an OFDM multiplexer), transmission codes or even a combination of such resources. As previously mentioned, the source terminal and the relay terminal use distinct resources. For example, the source terminal could transmit a data packet on a first interval of subcarriers (or chunk) and the terminal could relay it (after having decoded, interleaved and recoded it) on a second interval of subcarriers which is distinct from the former. However, the invention should not be restricted to the use of a particular type of transmission resources.

Figure 4:
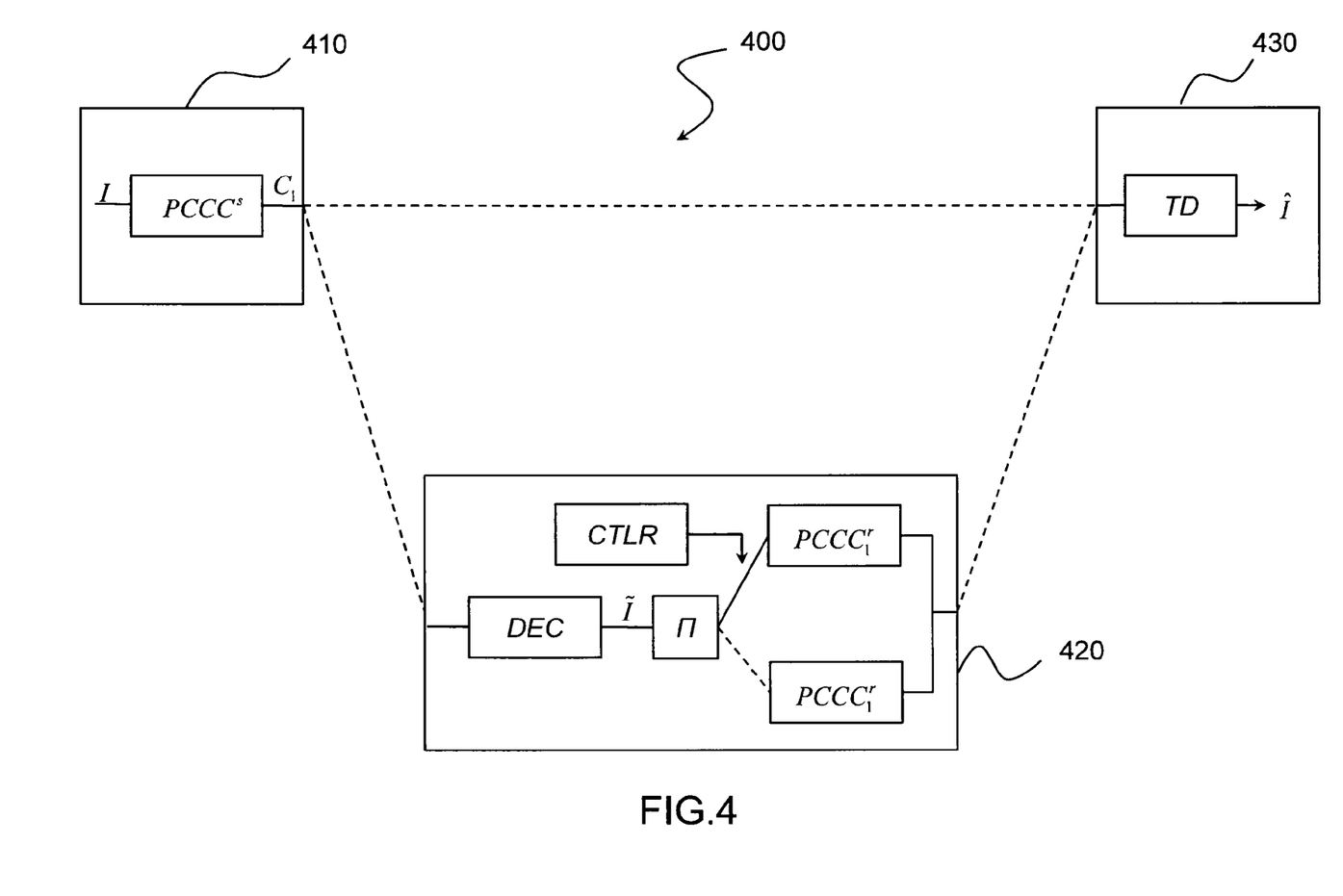
FIG. 4 schematically illustrates a cooperative network according to a first embodiment of the invention.

FIG. 4 schematically illustrates a cooperative network according to a first embodiment of the invention.

It is represented a source terminal in 410, a relay terminal in 420 and a recipient terminal in 430. Generally, the cooperative network can implement a plurality of relay terminals for relaying data packets from the source terminal to the recipient terminal. For purposes of simplification but still as a generality, it will be assumed in the following that a single relay terminal is used.

The source terminal comprises a first convolutional coder $PCCC^s$ for coding the packets of information bits I. If necessary, thus coded packets undergo a puncturing before being modulated by a bit to symbol modulator. For simplification purposes, the (optional) puncturer as well as the bit to symbol modulator are not represented. The obtained modulation symbols are then transmitted by the source terminal on a first transmission resource. For example, these symbols can modulate the subcarriers of an OFDM multiplex (more precisely the subcarriers of a chunk) or be spectrally spread using a code, in a known manner per se.

The relay terminal receives the signal transmitted by the source terminal and demodulates it to obtain the coded data packet. Thus obtained bits are then decoded by the decoder DEC and then recoded by a second convolutional coder $PCCC_n^r$, selected from a plurality N of predetermined convolutional coders $PCCC_1^r, \ldots, PCCC_N^r$. These convolutional coders advantageously correspond to codes having different minimum distances. They can in particular be systematic recursive coders with impulse responses having different cycle lengths. The selection of the second convolutional coder from N is controlled by the controller CTLR. The packet of bits recoded by the second convolutional coder is then bit to symbol modulated before being transmitted on a second transmission resource distinct from the first one.

The recipient terminal 430 receives a first packet coded by a first convolutional coder $PCCC^s$ via the transmission channel s-d and a second packet coded by the second selected convolutional coder $PCCC_n^r$, via the transmission channel r-d, the first and second coded packets being obtained from the same packet of information bits I. The turbocoder TD forms decoding iterations using a first unit decoder corresponding to the first convolutional coder and a second unit decoder corresponding to the second convolutional coder, in a known manner per se.

Generally, the selection of the second convolutional coder depends on a characteristic of the transmission channel s-r and/or the transmission channel r-d.

According to a first alternative, this characteristic is the type of the channel concerned and more precisely the type of the environment in which it is located. For example, the relay terminal can comprise two second convolutional coders $PCCC_1^r$ and $PCCC_2^r$, the first dedicated to an urban environment and the second to a rural environment. The type of environment can be locally provided by the cooperative network, for example in a cell network, by the base station of the cell in which the terminals are located. Alternatively, both convolutional coders can be respectively dedicated to the case where the recipient terminal is fixed and the case where it is mobile. For example, the recipient terminal can measure the Doppler shift of a carrier frequency or measure its rate using a GPS positioning system and inform the relay terminal about it.

According to a second alternative, the characteristic is information about the channel state s-d and/or the channel r-d. This information about the channel state can for example be assessed by the recipient terminal using pilot symbols. Thus, if it is assumed that the channels s-d and r-d use a first and a second intervals of subcarriers of an OFDM multiplex respectively, pilot symbols spread in the first interval and the second interval will enable the recipient terminal to assess the attenuation coefficients of both channels concerned. Alternatively, the recipient terminal could determine the bit error rate, BER or the packet error rate, (or Frame Error Rate, FER) on the channel s-d, the channel r-d or even both channels. For that purpose, besides the convolutional coding, a detection coding (CRC) or an error correction coding (ECC) will be provided within the source terminal and/or the relay terminal.

The bit error rate or the packet error rate can be determined by the recipient terminal for each received packet, at the end of the turbodecoding iterations. It can alternatively be averaged over the duration of transmission period.

The information about the channel state can further comprise the signal to noise ratio (SNR) on one of the transmission channels s-d or r-d, or even both channels. The recipient terminal assesses this ratio for example thanks to pilot symbols: the distance between the symbol actually received on a channel and the pilot symbol of the modulation constellation enables the signal to noise ratio to be assessed on this channel.

In any case, the information about the channel state (attenuation coefficient, PER, PEB, SNR) is assessed by the recipient terminal and is sent back to the relay terminal. From this information, the controller CTLR controls the selection of the second convolutional coder from N. It will be understood that the source terminal is at this time only aware of the second distributed turbocoding component and that the selection is autonomous in the relay terminal. Alternatively, according to one embodiment not represented, the information about the channel state is sent back to the source terminal and the latter controls the selection of the second convolutional coder within the relay terminal. More precisely, the source terminal then transmits a selection signal to the relay terminal, for example on an auxiliary channel, and the relay terminal then only selects the second convolutional coder based on instructions provided by the detection signal.

Before specifying the selection criterion of the second convolutional coder, it should be reminded that the curve giving the bit error rate (BER) as a function of the signal to noise ratio ($Eb/N_0$ or SNR) of a turbocode has two operating regions. A first region, called waterfall, having a low SNR level, wherein the curve has a strong slope and a second region, called error floor, having a high SNR level, wherein the curve has a small slope. In a conventional turbocode, the components, that is the convolutional codes composing it (generally systematic recursive codes) are identical. Such a turbocode is for that reason also called "symmetric". Symmetric turbocodes generally enable good performances in terms of bit error rate (or packet error rate) to be obtained either in the waterfall region, or in the error floor region but not in both regions. For that reason, it has been proposed to use so-called "asymmetric" turbocodes, wherein the components are different. A description of asymmetric turbocodes and their properties will be found in the article to O.Y. Takeshita et al. entitled "A note on asymmetric turbo-codes" published in IEEE Comm. Letters, Vol. 3, n° 3, March 1999, pages 69-71 and in the article to P.C. Massey et al. entitled "New developments in asymmetric turbo codes" published in "Proc. of International symposium on turbo codes and related topics >>, pages 93-100, Brest, France, 2000.

It is first assumed that the first constituent code, used in the source terminal, is a weak code, that is a code having a low minimum distance, or similarly, if it is a systematic recursive code, a short cycle code. More precisely, by weak code, it will be meant a convolutional code the minimum distance of which is lower than that of the Berrou systematic recursive code, that is a code defined by the transfer function $$g(D) = \frac{1+D^4}{1+D^2+D^3+D^4}$$

(it is remembered that the polynomial in the denominator represents the recursive part and that in the numerator the direct part or FF), having a rate ½, such as specified in the abovementioned article to P.C. Massey et al. Conversely, a code having a high minimum distance, or similarly, if it is a systematic recursive code, a long cycle code will be called strong code. More precisely, once again a comparison with the systematic recursive code used by Berrou will be referred to to characterise the code.

The weak code PCCC$^s$ used in the source terminal enables, during turbodecoding, extrinsic information having a good reliability degree to be obtained for the case of the waterfall region and thus having a low signal to noise ratio. When the channel is located in an urban type environment, or when the attenuation coefficient of the channel is low (strong attenuation on the channel), when the bit or packet error rate on the channel is high or even when the signal to noise ratio is low, a second convolutional code, also weak, is selected so as to obtain good performances in the waterfall region. By channel, it is herein intended all the channels s-d and r-d, or even the channel r-d only.

Conversely, when the channel is located in a rural environment, or when the coefficient of the channel is close to 1 (low attenuation on the channel), when the bit or packet error rate is low, or even when the signal to noise ratio is high, a second strong convolutional code is selected so as to obtain good performances in the error floor region.

For example, in the case where N=2, for PCCC$^s$ and PCCC$_1^r$ the Berrou coder could be used having the transfer function:

$$g_0(D) = \frac{1+D^4}{1+D^2+D^3+D^4} \quad (1)$$

and for PCCC$_2^r$ the recursive coder could be used having the transfer function:

$$g_1(D) = \frac{1+D+D^2+D^4}{1+D^3+D^4} \quad (2)$$

or even that having the transfer function:

$$g_2(D) = \frac{1+D+D^2+D^4+D^5+D^6}{1+D^3+D^3+D^5+D^6} \quad (3)$$

If N=3, for PCCC$_1^r$, PCCC$_2^r$ and PCCC$_3^r$, the coder shaving the respective transfer functions $g_0(D)$, $g_1(D)$ and $g_2(D)$ could be used.

In practice, to apply the criterion relating to the attenuation coefficient, to the bit error rate, to the packet error rate, to the signal to noise ratio, the controller compares the information about the channel state to a threshold value. In the abovementioned example, with N=2, the controller MR will compare for example the SNR value on the channel, assessed by the recipient terminal with a predetermined threshold SNR$_{Th}$: if it is higher than this threshold, the coder PCCU$_1^r$ will be selected and otherwise, the controller will select the coder PCCC$_2^r$.

If it is assumed now that the first convolutional coder is strong, the second weak convolutional coder will be selected for the case of the waterfall region and a second strong convolutional coder for the case of the error floor region.

According to a third alternative, the transmission channel is modelled by a non-ergodic block fading channel, which is a realistic hypothesis in mobile telephony as soon as the terminals are in direct line of sight (LOS). More precisely, it is assumed herein that the transmission channel s-d and the transmission channel r-d are block fading channels. The fadings can be time and/or frequency block fadings depending on whether a time interval and/or frequency interval transmission is considered. By way of illustration, it will be assumed in the following that the source terminal and the relay terminal use as transmission resources intervals of subcarriers (chunks) of an OFDM multiplex. The OFDM transmission channel can be modelled by a set of L unit channels (subchannels), each unit channel L corresponding to an interval of subcarriers and being characterized by an attenuation coefficient $\alpha_l$. Still as a generality, it will be assumed that the coefficient is constant on a data packet (more precisely, on the packet encoded by the first convolutional coder and the second corresponding packet encoded by the second convolutional coders). In this case, the coefficient $\alpha_l$ can be considered as a random variable associated with a block, the block comprising one or more packets. The random variables $\alpha_l$ relating to two distinct blocks are independent and of the same probability distribution law, for example a Rice distribution law. The vector a=($\alpha_1, \ldots, \alpha_L$) is a random vector having L independent components.

In this alternative, the recipient terminal measures the attenuation coefficients $\alpha_1, \ldots, \alpha_L$, for each block on the L unit channels (using pilot symbols) and updates the probability distributions of each of these coefficients, or similarly of the distribution law of the vector a, p(a), these distribution laws being transmitted to the relay terminal or the source terminal, depending on whether one or the other controls the selection of the second convolutional coder. In both cases, the probability distributions of the coefficients are locally stored (source terminal or relay terminal depending on the case) in a table updated over time.

The idea underlying this alternative is to use as a selection criterion a probability bound, called union bound, majorizing the bit error probability or packet error probability output from the turbodecoder. More precisely, this bound is calculated for each turbocode having the components (PCCC$^s$, $PCCC_1^r$), ..., ($PCCC^s$, $PCCC_N^r$) and the second convolutional coder corresponding to the smallest bound is then selected.

When the coders $PCCC^s$, $PCCC_n^r$ are systematic recursive coders, it can be shown that the bit error conditional probability output from the turbodecoder, knowing the vector a, is majorized by the bound:

$$P_{eb}|a = \sum_{w=w_{min}}^{P} \frac{w}{P} \sum_{j=j_{min}}^{2P} A_{w,j} \sum_{d,d} p(d,d) \text{erfc}\left(\sqrt{\frac{2R_c E_b}{N_0} \sum_{l=1}^{L} d_l \alpha_l^2}\right) \quad (4)$$

and, similarly, the packet error conditional probability output from the turbodecoder, knowing the vector a, is majorized by the bound:

$$P_{ew}|a = \sum_{w=w_{min}}^{P} \sum_{j=j_{min}}^{2P} A_{w,j} \sum_{d,d} p(d,d) \text{erfc}\left(\sqrt{\frac{2R_c E_b}{N_0} \sum_{l=1}^{L} d_l \alpha_l^2}\right) \quad (5)$$

the summation on d being performed for the vectors $d=(d_1, \ldots, d_L)$ such that $$\sum_{l=1}^{L} d_l = d$$

where the components $d_l$ are defined hereinafter.

In the expressions (4) and (5), it has been assumed that N=2 (selection of a systematic recursive coder from two within the relay terminal) and it has been noted:

P the number of information bits per packet input to the distributed turbodecoder or, similarly, the number of bits in the systematic part of the packet; w the Hamming weight of this systematic part, $w_{min}$ the minimum value of this weight; $j=j_1+j_2$ where $j_1$ and $j_2$ are the Hamming weights of the parity bits output from the first systematic coder and the second systematic recursive coder, respectively; $j_{min}$ the minimum value of j; erfc is the Gaussian complementary error function; $d_l$ is the Hamming weight of the $k_l$ bits (systematic bits and parity bits) transmitted on the unit channel l, $d=j+w$ is the Hamming weight of the distributed turbocode, $R_c$ is the rate of the distributed turbocode, $$\frac{E_b}{N_0}$$

is the signal to noise ratio on each unit channel; and:

$$A_{w,j} = \sum_{\substack{j_1,j_2 \\ j_1+j_2=j}} \frac{A_{w,j_1}^s A_{w,j_2}^r}{\binom{P}{w}} \quad (6)$$

where $A_{w,j_1}^s$ and $A_{w,j_2}^r$ are respectively the number of code words having the weight $w+j_1$ output from the first systematic recursive coder (located in the source terminal) and the number of code words having the weight $w+j_2$ output from the second systematic recursive coder selected in the relay terminal and $$\binom{P}{w}$$

is the number of combinations of w bits from P; p(d,d) represents the averaging effect impact due to the interleaver and can be expressed as:

$$p(d,d) = \frac{\binom{k_1}{d_1}\binom{k_2}{d_2}\cdots\binom{k_L}{d_L}}{\binom{3P}{d}} \quad (7)$$

The expressions (4) and (5) give the respective bounds of bit and packet error probabilities knowing the vector of the attenuation coefficients on the unit channels.

From the probability law p(a), that is the probability distributions of the attenuation coefficients stored in the above-mentioned table, an averaged upper bound can be calculated:

$$P_{eb}^m = \int_0^{+\infty} P_{eb}|a \cdot p(a) da \text{ and} \quad (8)$$

$$P_{ew}^m = \int_0^{+\infty} P_{ew}|a \cdot p(a) da \quad (9)$$

The summation being herein performed on the positive values of $\alpha_l$.

These average upper bounds are relatively loose and strict average upper bounds will be advantageously calculated using:

$$P_{eb}^m = \int_0^{+\infty} \min\left(\frac{1}{2}, P_{eb}|a\right) \cdot p(a) da \quad (10)$$

$$P_{ew}^m = \int_0^{+\infty} \min\left(\frac{1}{2}, P_{ew}|a\right) \cdot p(a) da \quad (11)$$

The terminal in charge of controlling the selection of the second convolutional coder calculates the average upper bound $P_{eb}^m$, according to the expression (8) or (10), or even the upper bound $P_{ew}^m$, according to the expression (9) or (11), for both coders $PCCC_1^r$, $PCCC_2^r$, and more generally for the N coders $PCCC_1^r, \ldots, PCCC_N^r$, and deduces the one which makes the lowest average upper bound therefrom. This convolutional coder is then selected for the transmission of the following packet or for the transmission of packets for the given period, corresponding to the updating frequency of p(a).

According to a fourth alternative, the selection controller directly uses the measure of the attenuation coefficients $\alpha_1, \ldots, \alpha_L$ to assess the bit error or packet error probability upper bound and select the second convolutional coder making the lowest upper bound. If it is noted $\hat{a}=(\hat{\alpha}_1, \ldots, \hat{\alpha}_L)$ the vector of the attenuation coefficients obtained at the latest measurement, then the bound $P_{eb}^m$ or bound $P_{ew}^m$ is simply determined as follows:

$$P_{eb}^m = P_{eb}|\hat{a} \quad (12)$$

$$P_{ew}^m = P_{ew}|\hat{a} \quad (13)$$

where $P_{eb}|a$ and $P_{ew}|a$ are the expression given by the expressions (4) and (5) respectively.

The implementation of this alternative assumes that attenuation coefficients measured at the preceding transmission period are a good assessment of the attenuation coefficients of unit channels at the following transmission period, that is the unit channels hardly vary between two measurement instants.

Figure 5:
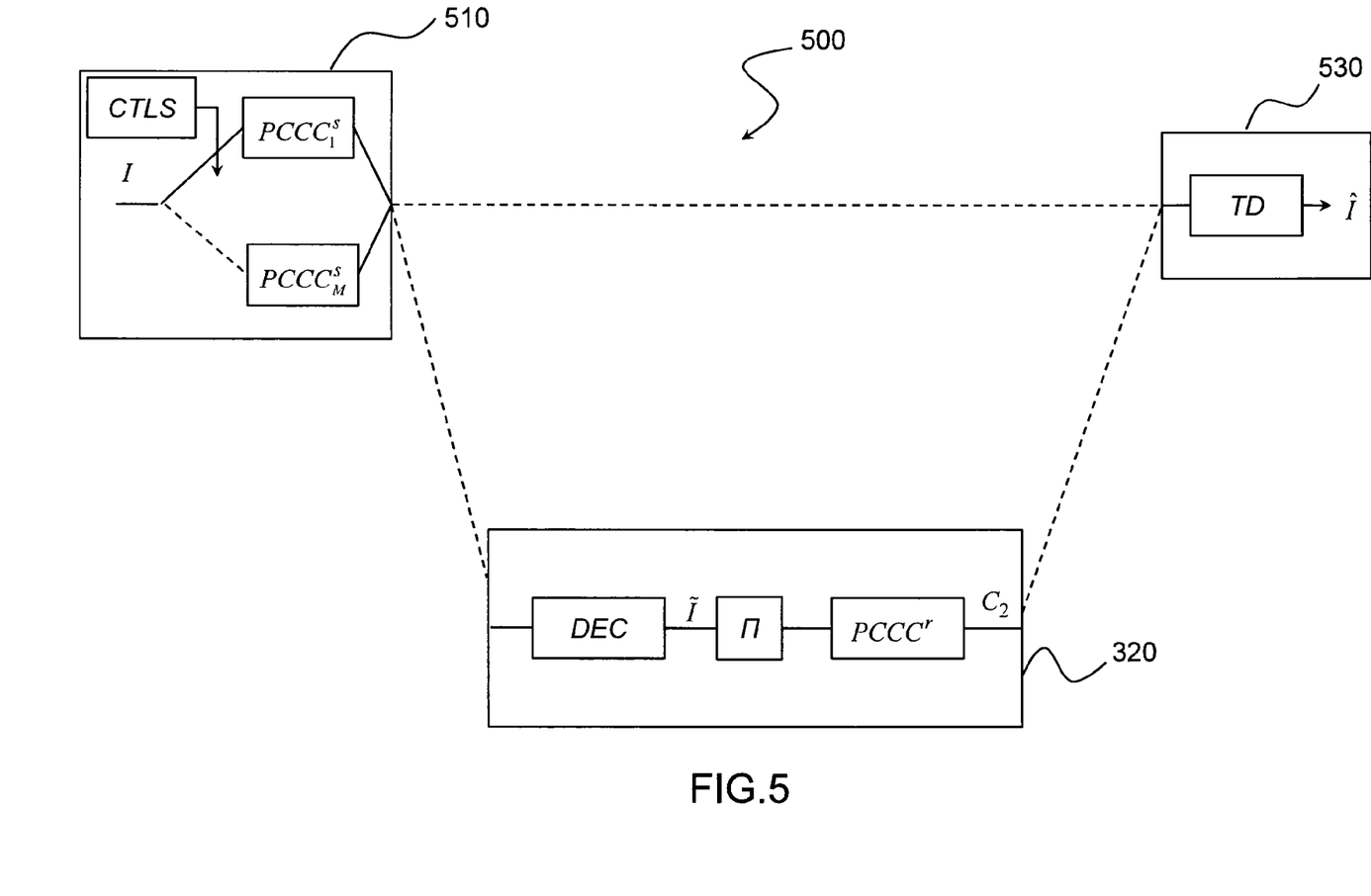
FIG. 5 schematically illustrates a cooperative network according to a second embodiment of the invention.

FIG. 5 schematically illustrates a cooperative network according to a second embodiment of the invention.

In this embodiment, the second convolutional coder, designated by $PCCC^r$ is fixed whereas the first convolutional coder is adaptive. More precisely, the first convolutional coder, located in the source terminal 510 is selected from a plurality M of first predetermined convolutional coders, noted $PCCC_1^s, \ldots, PCCC_M^s$, the selection being performed, as previously, from a characteristic of the transmission channel s-r and/or the transmission channel r-d. Unlike the first embodiment, the control of the selection is always performed at the source terminal, by means of a controller designated by CTLS.

Those skilled in the art will understand that the different alternatives set out within the scope of the first embodiment can be similarly provided in the second embodiment, so that the description thereof will not be repeated herein. It will just be set out that, within the scope of the second alternative, a weak convolutional code is selected if the channel is in an urban type environment, when the attenuation coefficient of the channel is weak (strong attenuation on the channel), or when the bit or packet error on the channel is high or even when the signal to noise ratio is low. Conversely, a strong convolutional code is selected if the channel is in a rural type environment, when the attenuation coefficient of the channel is high (low attenuation on the channel), or when the bit or packet error rate on the channel is low or even when the signal to noise ratio is high.

Figure 6:
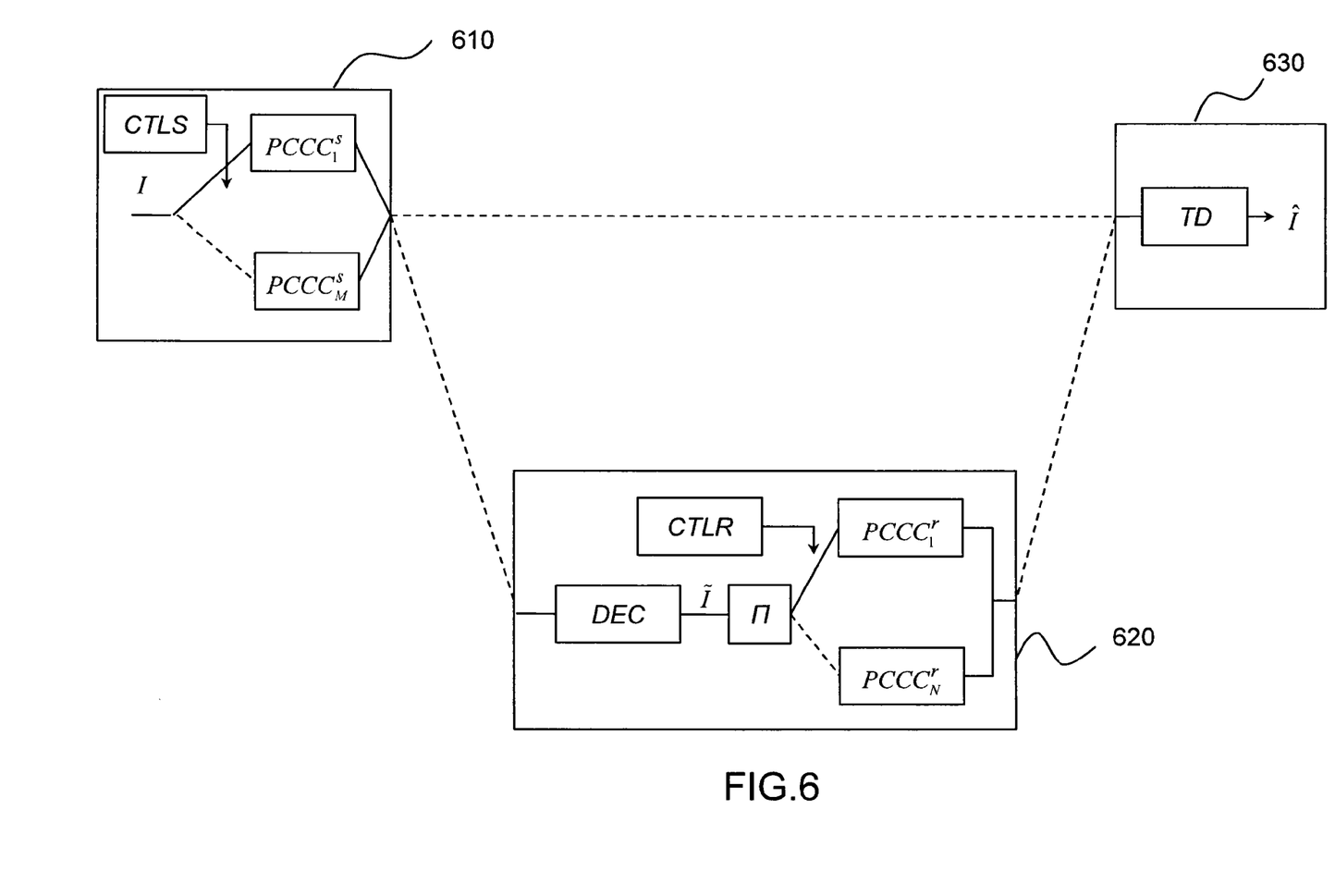
FIG. 6 schematically illustrates a cooperative network according to a third embodiment of the invention.

FIG. 6 schematically represents a cooperative network according to a third embodiment of the invention.

In this embodiment, the first and second convolutional coders are adaptive. More precisely, the first convolutional coder is selected from a plurality M of first predetermined convolutional coders, noted $PCCC_1^s, \ldots, PCCC_M^s$, and the second convolutional coder is selected from a plurality N of second predetermined convolutional coders, noted $PCCC_1^r, \ldots, PCCC_N^r$. The control of the selection from the first convolutional coders is performed by a first controller, CTLS, located in the source terminal 610, and the control of the selection from the selected convolutional coders is performed by a second controller, CTLR, located in the relay terminal 620. Alternatively, the control of the selection of the first and second convolutional coders is centralized at the source terminal, in other words it is performed only by the controller CTLS.

Those skilled in the art will understand that the third embodiment is a combination of the first and second embodiments, so that this third embodiment is provided according to the fourth previously set out alternatives without needing to describe them again.

The third embodiment however includes a fifth specific alternative. In this fifth alternative, the control of the selection is centralized at the source terminal 610. The recipient terminal 630 separately assesses the state of the channel s-d and the status of the channel r-d and transmits both states to the controller CTLS.

The selection is then performed as follows:

If the attenuation coefficient of the channel s-d is lower than that of the channel r-d, or if the bit/packet error rate on the channel s-d is higher than that on the channel r-d, or even if the signal to noise ratio on the channel s-d is lower than that on the channel r-d, a first convolutional coder weaker than the second convolutional coder will be selected. In the opposite case, a first convolutional coder stronger than the first convolutional coder is selected. In this way, the turbodecoder benefits in all the cases from the best reliability of extrinsic information provided by the decoder associated with the lowest coder in the waterfall region and from the best convergence due to the decoder associated with the highest coder in the error floor region.

In the description of the embodiments of the invention, a source terminal, a relay terminal and a recipient terminal have been simply referred to without specifying the very nature of these terminals. Those skilled in the art will understand that the source terminal can be a base station, in which case the recipient terminal is a user terminal, and on the contrary, the source terminal can be a user terminal, in which case the recipient terminal is a base station. Thus, the present invention is applicable to both uplink and downlink communications.

The invention claimed is:

1. A method for transmitting data packets for a cooperative network including a source terminal, a recipient terminal, and at least one relay terminal, comprising:
    the source terminal coding a data packet using a first convolutional coder for generating a first coded packet and transmitting it to the recipient terminal and to the relay terminal,
    the relay terminal receiving and decoding the first coded packet, interleaving data of a thus decoded packet and coding the interleaved data packet using a second convolutional coder for generating a second coded packet and transmitting it to the recipient terminal, the first and second convolutional coders forming a turbocoder distributed between the source terminal and the relay terminal, wherein:
    (a) the first convolutional coder is selected from a plurality of first predetermined convolutional coders; and/or
    (b) the second convolutional coder is selected from a plurality of second predetermined convolutional coders;
    the selection in (a) and/or (b) being performed from statistic of fading coefficients per block of the channel between the source terminal and the recipient terminal and/or the channel between the relay terminal and the recipient terminal.

2. The method for transmitting packets according to claim 1, wherein, for each first predetermined convolutional coder and/or second convolutional coder, a bit error or packet error conditional probabilities relating to different possible values of fading coefficients are calculated and bit error or packet error probability bounds that would be obtained using the first predetermined convolutional coder and/or second convolutional coder are deduced therefrom.

3. The method for transmitting packets according to claim 2, wherein the first predetermined convolutional coder and/or second convolutional coder enabling the lowest bit error rate or packet error rate bound to be obtained are selected.

4. The method for transmitting packets according to claim 1, wherein the source terminal controls both the selection of the first and/or second convolutional coder.

5. The method for transmitting packets according to claim 1, wherein the source terminal controls the selection of the first convolutional coder and/or the relay terminal controls the selection of the second convolutional coder.

* * * * *